United States Patent
Liu et al.

(10) Patent No.: US 9,116,383 B2
(45) Date of Patent: Aug. 25, 2015

(54) MANUFACTURING METHOD OF LIGHT BARRIER GLASS SHEET

(71) Applicants: BOE TECHNOLOGY GROUP CO., LTD., Beijing (CN); BEIJING BOE DISPLAY TECHNOLOGY CO., LTD., Beijing (CN)

(72) Inventors: Zheng Liu, Beijing (CN); Seung Min Lee, Beijing (CN); Seung Moo Rim, Beijing (CN); Huibin Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/352,805

(22) PCT Filed: Jun. 17, 2013

(86) PCT No.: PCT/CN2013/077319
§ 371 (c)(1),
(2) Date: Apr. 18, 2014

(87) PCT Pub. No.: WO2014/172969
PCT Pub. Date: Oct. 30, 2014

(65) Prior Publication Data
US 2015/0144589 A1 May 28, 2015

(30) Foreign Application Priority Data
Apr. 24, 2013 (CN) .......................... 2013 1 0145991

(51) Int. Cl.
H01B 13/00 (2006.01)
G02F 1/1335 (2006.01)
H01L 27/12 (2006.01)

(52) U.S. Cl.
CPC ...... *G02F 1/133512* (2013.01); *H01L 27/1262* (2013.01)

(58) Field of Classification Search
USPC .......................................... 216/13, 41; 430/5
See application file for complete search history.

(56) References Cited

U.S. PATENT DOCUMENTS

| 2004/0180480 A1* | 9/2004 | Dejima .................... 438/161 |
| 2009/0080099 A1 | 3/2009 | Tanimoto et al. |
| 2014/0175443 A1 | 6/2014 | Xie |

FOREIGN PATENT DOCUMENTS

| CN | 101228568 A | 7/2008 |
| CN | 101615594 A | 12/2009 |
| CN | 103035568 A | 4/2013 |

OTHER PUBLICATIONS

International Search Report dated Dec. 30, 2013; PCT/CN2013/077319.

(Continued)

*Primary Examiner* — Roberts Culbert
(74) *Attorney, Agent, or Firm* — Ladas & Parry LLP

(57) ABSTRACT

A manufacturing method of a light barrier glass sheet, comprising: forming a metal layer (2) on a glass substrate (1); coating a first photoresist layer (3) on the metal layer (2), performing first exposure on the first photoresist layer (3) through a half tone mask, then performing first development on the first photoresist layer (3); removing partial region of the metal layer (2) through a first etching process; removing a partial thickness and a partial region of the first photoresist layer (3) through an ashing process; forming an insulating layer (4) on the exposed glass substrate (1), the exposed metal layer (2), the first photoresist layer (3) after the ashing process, and sidewalls of the photoresist layer (3) after the ashing process; removing the first photoresist layer (3), the insulating layer (4) on the first photoresist layer (3), and the insulating layer (4) on the sidewalls of the first photoresist layer (3) by a photoresist lifting-off process so as to form a via hole (7); forming a transparent pixel electrode pattern (5) in the via hole (7), on sidewalls of the via hole (7) and on the insulating layer (4). With the method, one mask process can be omitted, thus the manufacturing process can be simplified, the production efficiency can be improved and the production cost can be reduced.

20 Claims, 4 Drawing Sheets

(56) References Cited

OTHER PUBLICATIONS

First Chinese Office Action dated Jul. 3, 2014; Appln. 201310145991.8.

Second Chinese Office Action dated Dec. 1, 2014; Appln. No. 201310145991.8.

* cited by examiner

MANUFACTURING METHOD OF LIGHT BARRIER GLASS SHEET

TECHNICAL FIELD

Embodiments of the present invention related to a field of parallax barrier, and particularly to a manufacturing method of light barrier glass sheet.

BACKGROUND

Light barrier 3D technology is also known as parallax barrier technology and has similar principle as that of polarization 3D technology. As shown in FIG. 1, a device for realizing the light barrier 3D technology generally comprises a lower polarizer 002, a light barrier glass sheet 003 and an upper polarizer 005 sequentially formed on a liquid crystal display panel 001, and a liquid crystal layer 004 is encapsulated between the light barrier glass sheet 003 and the upper polarizer 005. In the device, for example, a red light pixel region 006 and a green light pixel region 007 for respectively emitting red light and green light are disposed in the liquid crystal display panel 001.

The light barrier glass sheet 003 comprises a metal layer (not shown in the figure), an insulating layer (not shown in the figure), and a transparent pixel electrode layer 008. The pixel electrode layer 008 comprises a plurality of strip-like pixel electrodes. Each of the strip-like pixel electrode has a width of several tens microns. There is a gap (slit) between the pixel electrodes of two adjacent strip-like pixel electrodes. Light emitted from different pixel regions of the liquid crystal display panel 001 sequentially pass the lower polarizer 002, the light barrier glass sheet 003, the liquid crystal layer 004 and the upper polarizer 005 and then enter the eyes of an observer. Liquid crystal molecules in the liquid crystal layer 004 located above the strip-like pixel electrodes are oriented along a longitudinal direction which is perpendicular to the direction of the lower polarizer 002. Liquid crystal molecules located above the gap between the strip-like pixel electrodes are oriented along a lateral direction which is parallel to the direction of the lower polarizer 002. When light pass the liquid crystal molecules oriented along the longitudinal direction, the polarization direction of the light remains unchanged. In this case, when the light travels to the upper polarizer 005, it cannot transmit through the upper polarizer 005 to enter the eyes of the observer. When light passes the liquid crystal molecules oriented along the lateral direction, the polarization direction of the light is changed. In this case, when the light travels to the upper polarizer 005, it can transmit through to enter the eyes of the observer. Light emitted from the same pixel region of the liquid crystal display panel 001 can only enter into one eye of the observer, that is, the light can only enters into the left eye 009 or the right eye 010 of the observer, but fails to enter into both eyes of the observer. Therefore, the light barrier glass sheet is also referred to "parallax barrier".

Conventional manufacturing method of the light barrier glass sheet generally needs three mask processes, thus leads to a complicated process, low production efficiency and high production costs.

SUMMARY

An embodiment of the present invention provides a manufacturing method of a light barrier glass sheet.

The manufacturing method of a light barrier glass sheet according to the embodiment of the present invention comprises the following steps:

Forming a metal layer on a glass substrate;

Coating a first photoresist layer on the metal layer, performing first exposure on the first photoresist layer through a half tone mask, then performing first development on the first photoresist layer so as to form a completely remained region of the first photoresist layer, a half-remained region of the first photoresist layer and a completely removed region of the first photoresist layer which correspond to an opaque region, a half-transmitting region and a completely-transmitting region of the half tone mask, respectively;

Removing the metal layer corresponding to the completely removed region of the first photoresist layer and portions of the metal layer corresponding to the half-remained region of the first photoresist layer and the completely remained region of the first photoresist layer through a first etching process to expose partial region of the glass substrate;

Removing a partial thickness and a partial region of the first photoresist layer which is subjected to the first development through an ashing process to expose partial region of the metal layer remained after the first etching process;

Forming an insulating layer on the exposed glass substrate, the exposed metal layer, the first photoresist layer after the ashing process, and sidewalls of the photoresist layer after the ashing process;

Removing the first photoresist layer after the ashing process, the insulating layer on the first photoresist layer after the ashing process, and the insulating layer on the sidewalls of the first photoresist layer after the ashing process by a photoresist lifting-off process so as to form a via hole on the metal layer to expose partial region of the metal layer corresponding to the via hole;

Forming a transparent pixel electrode pattern in the via hole, on sidewalls of the via hole and on the insulating layer.

The step of forming a transparent pixel electrode pattern in the via hole, on the sidewalls of the via hole and on the insulating layer may further comprise the following steps: forming a transparent pixel electrode layer on the insulating layer, in the via hole, and on the sidewalls of the via hole; coating a second photoresist layer on the pixel electrode layer; performing second exposure on partial region of the second photoresist layer by using a conventional mask; performing second development on the second photoresist layer; removing the exposed pixel electrode layer through a second etching process; and lifting off the remained second photoresist layer to obtain a transparent pixel electrode pattern.

A material of the pixel electrode may be Indium Tin Oxide.

After being subjected to the first development, the first photoresist layer may have a protrusion shape in which a middle portion is thick and both side edges are thin.

After being subjected to the first etching, both side edges of the remained metal layer may have a slope shape.

After being subjected to the first etching, the metal layer may have a width smaller than width of the first photoresist layer which is subjected to the first development.

The first photoresist layer after the ashing process may have a cross-section of rectangular shape.

The first photoresist layer after the ashing process may have a width smaller than a width of the metal layer after the first etching process.

DETAILED DESCRIPTION

In order to make objects, technical solutions and advantages of the embodiments of the invention apparent, the technical solutions of the embodiment will be described clearly and fully in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention. Hereinafter, various exemplary embodiments are described in detail with reference to the accompanying drawings. Obviously, the following embodiments are used to explain the present invention, and are not intend to limit the present invention.

The content of the present invention will be described below in more details in connection with the drawings and the embodiments.

A manufacturing method of the light barrier glass sheet according to the present embodiment comprises the following steps.

Figure 1:
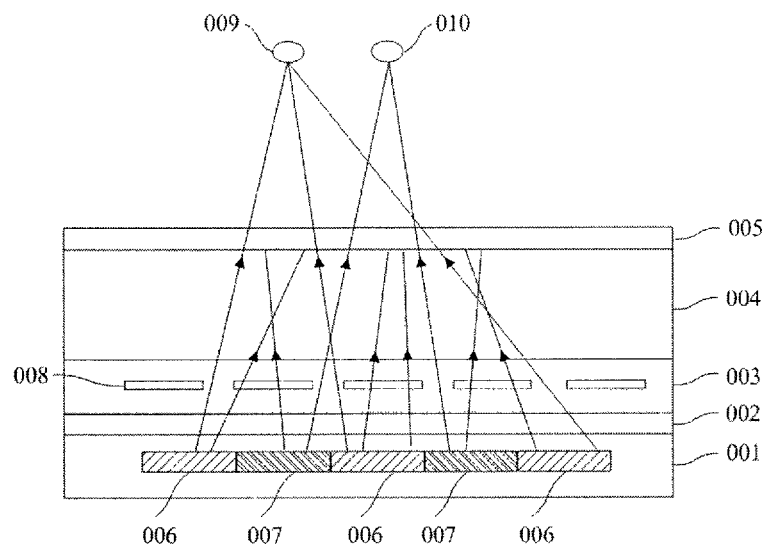
FIG. 1 is a cross-sectional view of a light barrier 3D technology in the prior art.
Figure 2:
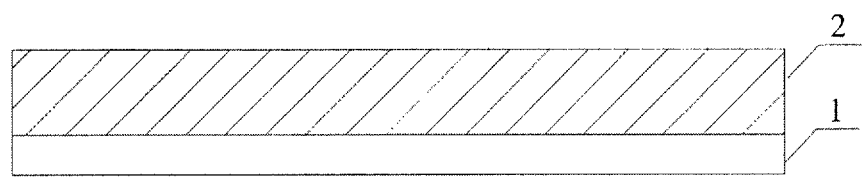
FIGS. 2-13 are schematic views illustrating manufacturing method of a light barrier glass sheet according to an embodiment of the present invention.

S1: as shown in FIG. 2, forming a continuous metal layer 2 on a glass substrate 1.

Figure 3:
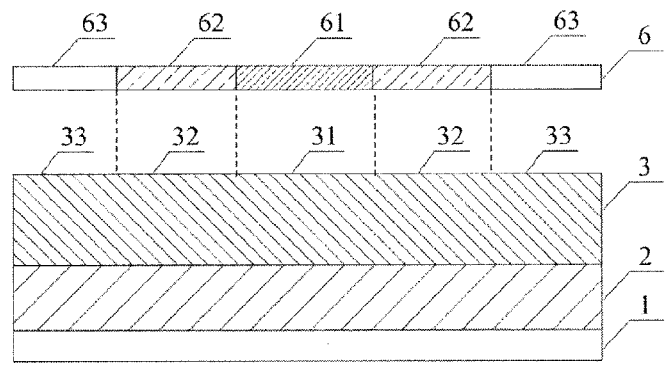
Figure 4:
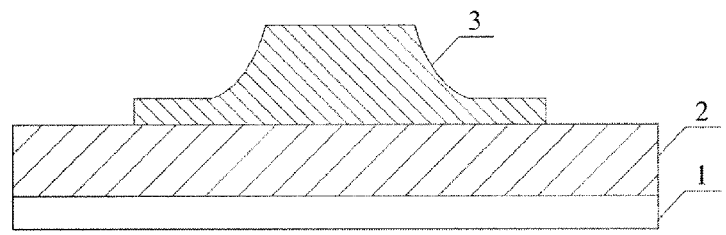

S2: as shown in FIGS. 3 and 4, coating a first photoresist layer 3 on the metal layer 2 and performing first exposure on the first photoresist layer 3 through a half tone mask (HTM) 6. The HTM 6 comprises an opaque region 61, a half-transmitting region 62 and a completely-transmitting region 63. After the first exposure, performing first development on the first photoresist layer 3. After the first development, forming a completely remained region 31 of the first photoresist layer 3 corresponding to the opaque region 61, a half-remained region 32 of the first photoresist layer 3 corresponding to the half-transmitting region 62, and a completely removed region 33 of the first photoresist layer 3 corresponding to the transmitting region 63. The first photoresist in the completely remained region 31 of the first photoresist layer 3 is completely remained. The first photoresist in the half-remained region 32 of the first photoresist layer 3 is partially removed, that is, the first photoresist in the half-remained region 32 becomes thinner. The first photoresist in the completely removed region 33 is completely removed. For example, after being subjected to the first development, the first photoresist layer 3 has a protrusion shape in which the middle portion is thick and both side edges are thin.

Figure 5:
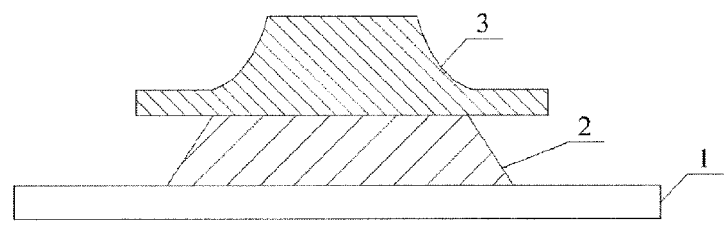

S3: as shown in FIG. 5, the metal layer 2 corresponding to the completely removed region 33 of the first photoresist layer 3 and portions of the metal layer 2 corresponding to the half-remained region 32 of the first photoresist layer 3 and the completely removed region 33 of the first photoresist layer 3 are removed by a first etching process so as to expose portions of the glass substrate 1. For example, after being subjected to the first etching, each side edge of the remained metal layer 2 have a slope shape, and after being subjected to the first etching, the metal layer 2 has a width smaller than the width of the first photoresist layer 3 which is subjected to the first development.

Figure 6:
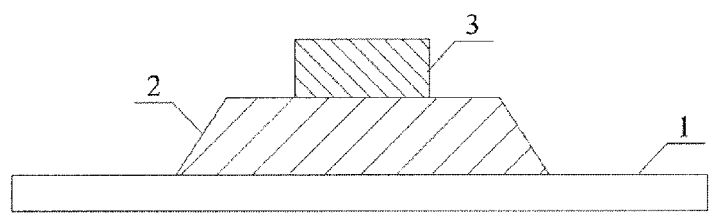

S4: as shown in FIG. 6, by removing a partial thickness and a partial region of the first photoresist layer 3 which is subjected to the first development through an ashing process, portions of the metal layer 2 which is remained after the first etching process are exposed. For example, the first photoresist layer 3 after the ashing process has a cross-section of rectangular shape, and the first photoresist layer 3 after the ashing process has a width smaller than the width of the metal layer 2 after the first etching process.

Figure 7:
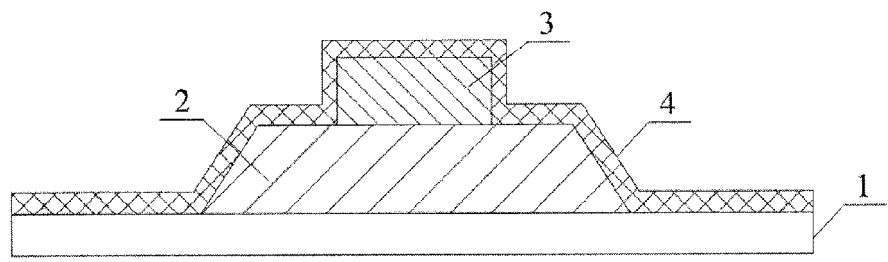

S5: as shown in FIG. 7, forming an insulating layer 4 on the exposed glass substrate 1, the exposed metal layer 2, the first photoresist layer 3 after the ashing process, and the sidewalls of the photoresist layer 3 after the ashing process.

Figure 8:
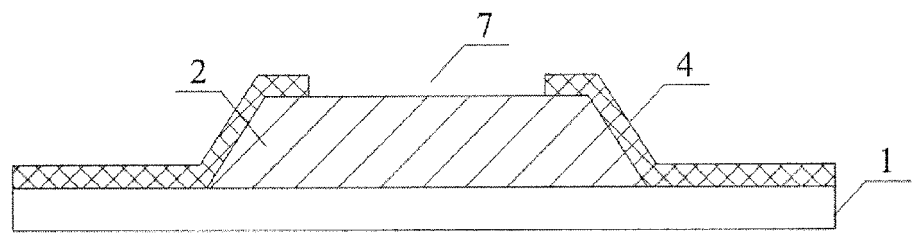

S6: as shown in FIG. 8, removing the first photoresist layer 3 after the ashing process, the insulating layer 4 on the first photoresist layer 3 after the ashing process, and the insulating layer 4 on the sidewalls of the first photoresist layer 3 after the ashing process by a photoresist lifting-off process so as to form a via hole 7 on the metal layer 2 to expose partial region of the metal layer 2 corresponding to the via hole 7.

S7: forming a transparent pixel electrode pattern in the via hole 7, on the sidewalls of the via hole 7 and on the insulating layer 4.

Figure 9:
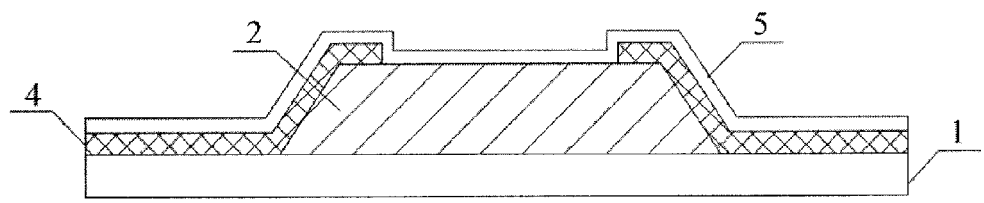

For example, the step S7 may further comprise the following steps:

S7.1: as shown in FIG. 9, forming a transparent pixel electrode layer 5 on the insulating layer 4, in the via hole 7, and on the sidewalls of the via hole 7. A material of the pixel electrode 5 may be Indium Tin Oxide (ITO).

Figure 10:
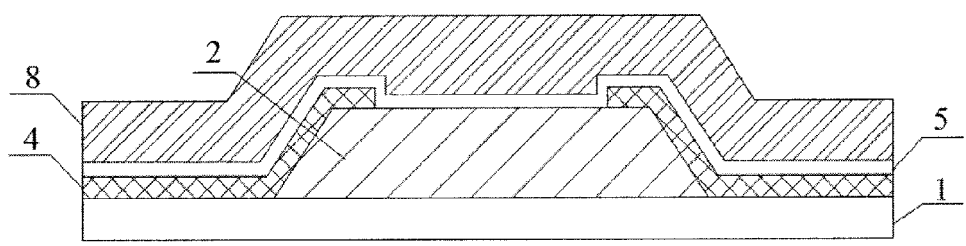

S7.2: as shown in FIG. 10, coating a second photoresist layer 8 on the pixel electrode layer 5.

S7.3: performing second exposure on partial region of the second photoresist layer 8 by using a conventional mask.

Figure 11:
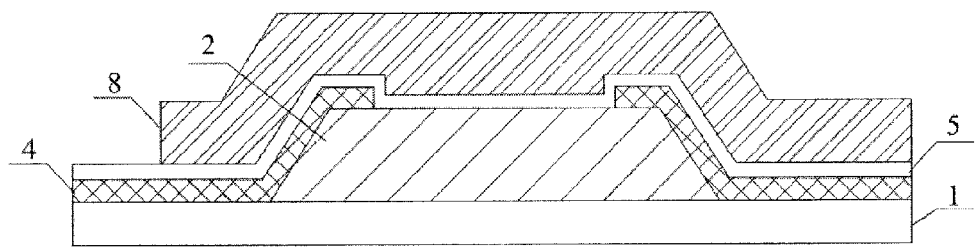

S7.4: as shown in FIG. 11, performing second development on the second photoresist layer 8 after the second exposure. After the second development, the second photoresist in the exposed region of the second photoresist layer 8 is completely removed and the second photoresist in the un-exposed region of the second photoresist layer 8 is completely remained.

Figure 12:
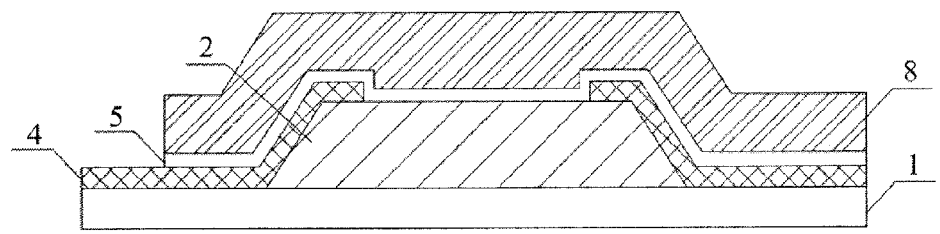

S7.5: as shown in FIG. 12, removing the exposed pixel electrode layer 5 through a second etching process, that is, removing the pixel electrode layer 5 not covered by the second photoresist layer 8 which is subjected to the second development.

Figure 13:
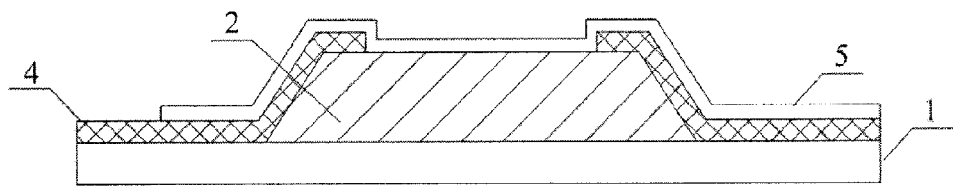

S7.6: as shown in FIG. 13, lifting off the remained second photoresist layer 8 to obtain a transparent pixel electrode pattern, thus a light barrier glass sheet is completed.

In the present embodiment, FIG. 13 merely illustrates one strip of the strip-like pixel electrode layer 5 in the light barrier glass sheet. However, the pixel electrode layer 5 in the light barrier glass sheet may comprise a plurality of strips.

In the light barrier glass sheet, the metal layer 2 is electrically connected to an outside circuit (not shown in the figures). The metal layer 2 transmits voltage signal to the transparent pixel electrode layer 5 through the via hole 7 and controls the deflect of the liquid crystal molecules by controlling the voltage applied to the pixel electrode layer 5. Since the pixel electrode layer 5 cross a plurality of metal layers 2, the insulating layer 4 is needed to insulate the metal layer 2 and the pixel electrode 5.

Compared with the conventional manufacturing method, the manufacturing method of light barrier glass sheet according to the embodiment of the present invention needs only two mask processes. Since one mask process can be omitted, the manufacturing process can be simplified, the production efficiency can be improved, and the production cost can be reduced.

The foregoing is merely the exemplary embodiments of the present invention, and is not intended to limit the present invention. It will note for those skilled in the art that some modifications and substitutions without departing technical principle of the present invention are within the protection scope of the present invention.

The invention claimed is:

1. A manufacturing method of a light barrier glass sheet, comprising the following steps:

forming a metal layer on a glass substrate;

coating a first photoresist layer on the metal layer, performing first exposure on the first photoresist layer through a half tone mask, then performing first development on the first photoresist layer so as to form a completely remained region of the first photoresist layer, a half-remained region of the first photoresist layer and a completely removed region of the first photoresist layer which correspond to an opaque region, a half-transmitting region and a completely-transmitting region of the half tone mask, respectively;

removing the metal layer corresponding to the completely removed region of the first photoresist layer and portions of the metal layer corresponding to the half-remained region of the first photoresist layer and the completely remained region of the first photoresist layer through a first etching process to expose a partial region of the glass substrate;

removing a partial thickness and a partial region of the first photoresist layer which is subjected to the first development through an ashing process to expose a partial region of the metal layer remained after the first etching process;

forming an insulating layer on the exposed glass substrate, the exposed metal layer, the first photoresist layer after the ashing process, and sidewalls of the photoresist layer after the ashing process;

removing the first photoresist layer after the ashing process, the insulating layer on the first photoresist layer after the ashing process, and the insulating layer on the sidewalls of the first photoresist layer after the ashing process by a photoresist lifting-off process so as to form a via hole on the metal layer to expose partial region of the metal layer corresponding to the via hole; and forming a transparent pixel electrode pattern in the via hole, on sidewalls of the via hole and on the insulating layer.

2. The manufacturing method of the light barrier glass sheet according to claim 1, wherein the step of forming a transparent pixel electrode pattern in the via hole, on the sidewall of the via hole and on the insulating layer further comprises the following steps:

forming a transparent pixel electrode layer on the insulating layer, in the via hole, and on the sidewalls of the via hole;

coating a second photoresist layer on the pixel electrode layer;

performing second exposure on partial region of the second photoresist layer by using a conventional mask;

performing second development on the second photoresist layer;

removing the exposed pixel electrode layer through a second etching process; and lifting off the remained second photoresist layer to obtain a transparent pixel electrode pattern.

3. The manufacturing method of the light barrier glass sheet according to claim 1, wherein a material of the pixel electrode is indium Tin Oxide.

4. The manufacturing method of the light barrier glass sheet according to claim 1, wherein after being subjected to the first development, the first photoresist layer has a protrusion shape in which a middle portion is thick and both side edges are thin.

5. The manufacturing method of the light barrier glass sheet according to claim 1, wherein after being subjected to the first etching, both side edges of the remained metal layer have a slope shape.

6. The manufacturing method of the light barrier glass sheet according to claim 5, wherein after being subjected to the first etching, the metal layer has a width smaller than a width of the first photoresist layer which is subjected to the first development.

7. The manufacturing method of the light barrier glass sheet according to claim 1, wherein the first photoresist layer after the ashing process has a cross-section of rectangular shape.

8. The manufacturing method of the light barrier glass sheet according to claim 7, wherein the first photoresist layer after the ashing process has a width smaller than width of the metal layer after the first etching process.

9. The manufacturing method of the light barrier glass sheet according to claim 2, wherein a material of the pixel electrode is Indium Tin Oxide.

10. The manufacturing method of the light barrier glass sheet according to claim 2, wherein after being subjected to the first development, the first photoresist layer has a protrusion shape in which a middle portion is thick and both side edges are thin.

11. The manufacturing method of the light barrier glass sheet according to claim 2, wherein after being subjected to the first etching, both side edges of the remained metal layer have a slope shape.

12. The manufacturing method of the light barrier glass sheet according to claim 11, wherein after being subjected to the first etching, the metal layer has a width smaller than a width of the first photoresist layer which is subjected to the first development.

13. The manufacturing method of the light barrier glass sheet according to claim 2, wherein the first photoresist layer after the ashing process has a cross-section of rectangular shape.

14. The manufacturing method of the light barrier glass sheet according to claim 13, wherein the first photoresist layer after the ashing process has a width smaller than width of the metal layer after the first etching process.

15. The manufacturing method of the light barrier glass sheet according to claim 4, wherein after being subjected to the first etching, both side edges of the remained metal layer have a slope shape.

16. The manufacturing method of the light barrier glass sheet according to claim 15, wherein after being subjected to the first etching, the metal layer has a width smaller than a width of the first photoresist layer which is subjected to the first development.

17. The manufacturing method of the light barrier glass sheet according to claim 4, wherein the first photoresist layer after the ashing process has a cross-section of rectangular shape.

18. The manufacturing method of the light barrier glass sheet according to claim 17, wherein the first photoresist layer after the ashing process has a width smaller than width of the metal layer after the first etching process.

19. The manufacturing method of the light barrier glass sheet according to claim 5, wherein the first photoresist layer after the ashing process has a cross-section of rectangular shape.

20. The manufacturing method of the light barrier glass sheet according to claim 19, wherein the first photoresist layer after the ashing process has a width smaller than width of the metal layer after the first etching process.

* * * * *